(12) United States Patent
Patapoutian

(10) Patent No.: US 6,236,343 B1
(45) Date of Patent: May 22, 2001

(54) LOOP LATENCY COMPENSATED PLL FILTER

(75) Inventor: Ara Patapoutian, Westborough, MA (US)

(73) Assignee: Quantum Corporation, Milpitas, CA (US)

( * ) Notice: Subject to any disclaimer, the term of this patent is extended or adjusted under 35 U.S.C. 154(b) by 0 days.

(21) Appl. No.: 09/311,653

(22) Filed: May 13, 1999

(51) Int. Cl.[7] .................................................... H03M 1/48
(52) U.S. Cl. ............................................. 341/111; 341/143
(58) Field of Search .................................. 341/111, 143; 327/155, 156, 158

(56) References Cited

U.S. PATENT DOCUMENTS

| | | | |
|---|---|---|---|
| 5,654,711 | * 8/1997 | Fujimori | 341/143 |
| 5,825,253 | * 10/1998 | Mathe et al. | 327/115 |
| 5,838,270 | * 11/1998 | Kiriaki | 341/143 |
| 5,949,361 | * 9/1999 | Fischer et al. | 341/143 |
| 6,028,544 | * 2/2000 | Zarubinsky et al. | 341/143 |

OTHER PUBLICATIONS

J.W.M. Bergmans, "Effect of Loop Delay on Stability of Discrete–Time PLL", 4/95 IEEE Transactions on Circuits and Systems–I:Fundamental Theory and Applications, vol. 42, No. 4.

Peter F. Driessen, "DPLL Bit Synchronizer with Rapid Acquisition Using Adaptive Kalman Filtering Techniques", Sep. 1994, IEEE Transactions on Communications, vol. 42, No. 9.

Grabt S. Christiansen, "Modeling of PRML Timing Loop as a Kalman Filter", GLOBECOM '94, vol 2, Nov. 28—Dec. 2, 1994.

* cited by examiner

*Primary Examiner*—Michael Tokar
*Assistant Examiner*—Don Phu Le

(57) ABSTRACT

The loop latency compensated PLL filter comprising two additional feedback terms, a delayed phase compensation signal and a state compensation signal, that are provided as input of a PLL filter. Accordingly, the PLL filter input comprises two additional compensation input signals: the delayed phase compensation signal and the state compensation signal in addition to a phase estimated error output from a phase detector that is also coupled to the input of the PLL filter. Consequently, PLL filter thus is able to provide a latency compensated phase error control output that is fedback to control a phase mixer to generate a square waveform used to drive an A/D of the PLL in accordance with the principles of this invention. The loop latency compensated PLL of this invention thus minimizes the jitter of the PLL circuit, provides higher format efficiency, and also has reduced sensitivity to large bursty noises.

8 Claims, 4 Drawing Sheets

LOOP LATENCY COMPENSATED PLL FILTER

FIELD OF INVENTION

Invention relates to phase-locked loop circuits (PLLs), and more particularly to PLLs in storage devices, such as disk drives.

BACKGROUND OF INVENTION

In the presence of initial disturbances such as phase and frequency steps, the optimal phase-locked loops (PLL) filter is known to have time varying form. Typical PLL filter designs based on frequency response techniques cannot handle time varying filters and hence generate sub-optimal results. It has been recognized for some time now that state space methods in general and Kalman filtering techniques in particular can be used to design and analyze synchronizers or PLL, such as surveyed in "Phase-Locked Loops," S. C. Gupta, Proceedings of the IEEE, vol. 63, no. 2, February 1975. More specifically, Kalman filtering theory enables us to derive optimal synchronizer structures for a given phase disturbance model, generate the time varying and steady state filter gain parameters, and calculate the time varying performance of the synchronizer. Usually, the filter gain parameters as well as the performance measure are found recursively using the Kalman recursions as described, for example, in "DPLL Bit Synchronizer With Rapid Acquisition Using Adaptive Kalman Filtering Techniques," P. F. Driessen, IEEE Transactions on Communications, vol. 42, no. 9, September 1994 and in "Modeling of A PRML Timing Loop As a Kalman Filter," G. S. Christiansen, GlobeCom '94, vol. 2, Nov. 28–Dec. 2, 1994.

An undesirable property of many discrete-time synchronizers is the inherent presence of loop delay, such as described in "Effect of Loop Delay on Stability of Discrete-Time PLL", J. W. M. Bergmans, IEEE Transactions on Communications, vol. 42, no. 4, April 1995, which not only makes the synchronizer less stable but also degrades the performance of the synchronizer. Moreover, conventional PLLs in magnetic recordings use lower signal-to-noise ratio (SNR) values and compensate for this loss by providing more coding and error correction coding (ECC). The typical PLL loop latency in present PRML read channels is about 15–25 cells.

FIG. 1, for example, illustrates a general system block diagram of a typical prior art PLL 10 (known as second order type II) used in most disk drives that use sampled detection. Typical PLL 10 comprises an analog-to-digital converter (A/D) 12 receiving an input analog signal 11. AID 12 is coupled to a phase detector 14 to detect an estimated phase error 15 in PLL 10. Estimated phase error 15 is provided as input to a proportional integral (PI) filter 29 comprising a first multiplier 16, a first accumulator 18, a second multiplier 30 and a first adder 22. Latency compensated phase error output 23 of PI filter 29 is then coupled to a second accumulator 24, also known as voltage controlled oscillator (VCO), that sums a phase component (alpha) from multiplier 30 and a delayed frequency component (beta) from a first accumulator 18 of PI filter 32. Second accumulator 24 provides as output a filtered phase error control signal 27 to drive a phase mixer 28.

As the signal to noise ratio (SNR) becomes lower, the phase error or jitter increases thereby degrading the PLL performance 10. Conventional designs of PLL such as PLL 10 focus on minimizing the latency in the PLL loop, and not on compensating the effect of latency. There is therefore an urgent need to optimize the PLL performance with respect to disturbance sources, and with respect to the loop latency.

SUMMARY OF INVENTION

A loop latency compensated PLL filter provided in accordance with the principles of this invention includes two additional feedback terms comprising a delayed phase compensation term and state compensation term. A linear, discrete time optimal synchronizers for pulse amplitude modulation (PAM) systems is provided using Kalman filtering techniques assuming Gauss-Markov phase disturbance model.

In loop latency compensated PLL filter, two additional feedback terms, a state compensation and a delayed phase compensation signal, are provided as input of a proportional integral filter (PI filter) of loop latency compensated PLL. Accordingly, the PI filter input comprises two additional compensation input signals: the delayed phase signal and the state signal, in addition to a phase estimated error output from a phase detector, that are coupled to the input of the PI filter. Consequently, PI filter thus is able to provide a latency compensated phase error control output that is fedback to control a phase mixer to generate a square waveform used to drive an A/D of the PLL in accordance with the principles of this invention. The loop latency compensated PLL of this invention thus minimizes the jitter of the PLL circuit, provides higher format efficiency, and also has reduced sensitivity to large bursty noises.

DETAILED DESCRIPTION OF PREFERRED EMBODIMENT(S)

Figure 1:
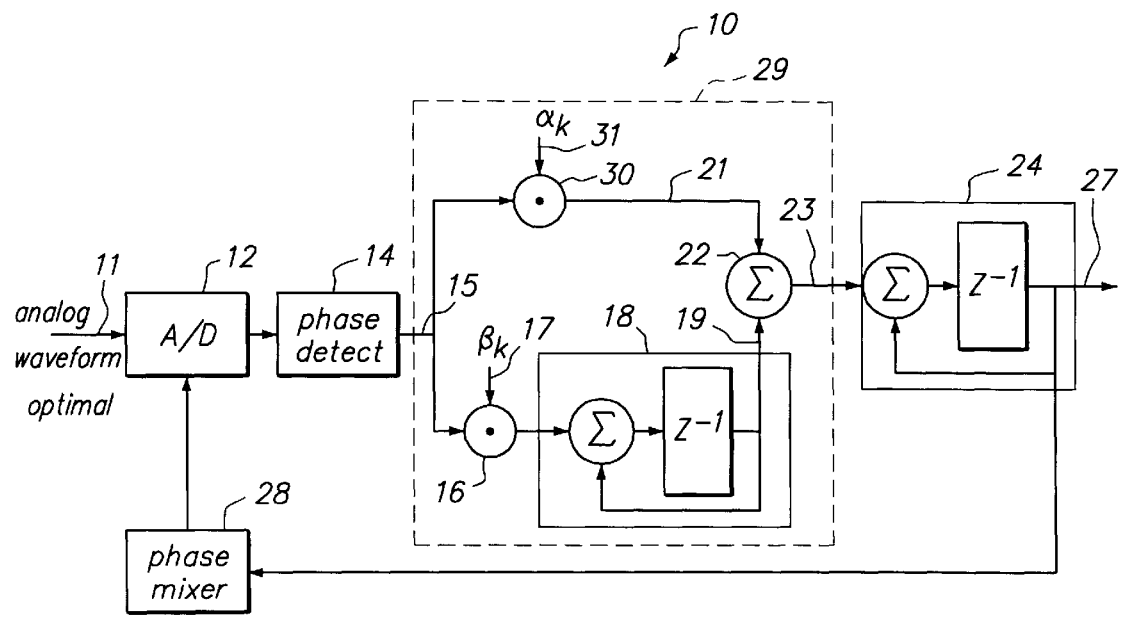
FIG. 1 is a system block diagram of a typical prior art second order type II PLL.
Figure 3:
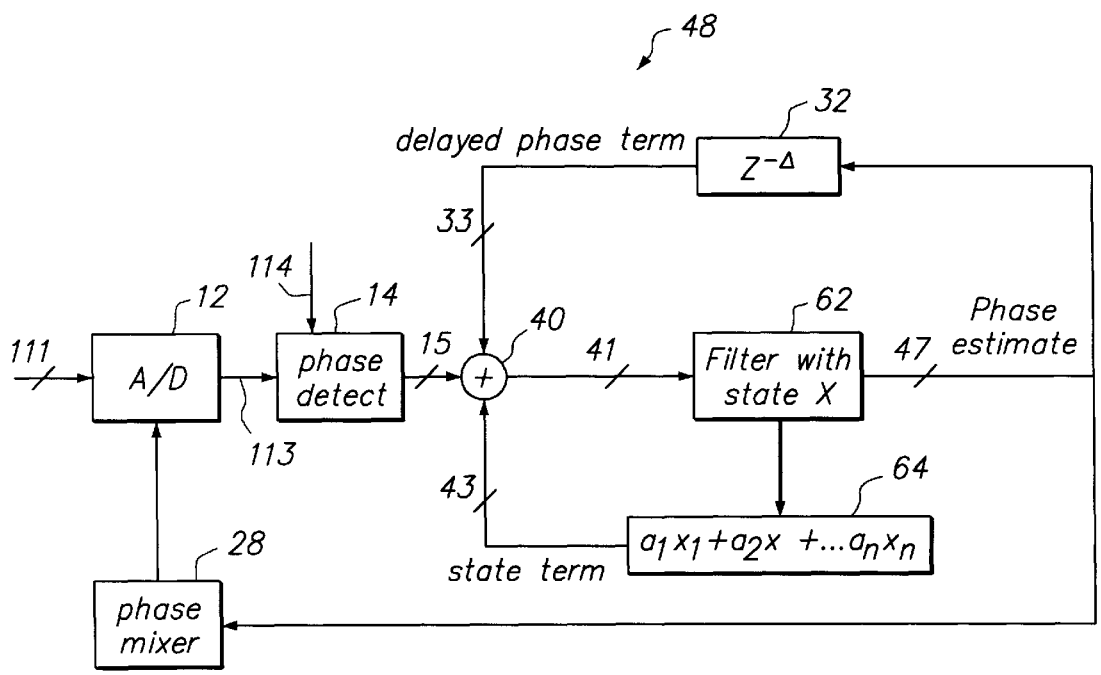
FIG. 3 is a generalized block diagram of the loop latency compensated PLL filter of FIG. 2 provided according to the principles of this invention.
Figure 2:
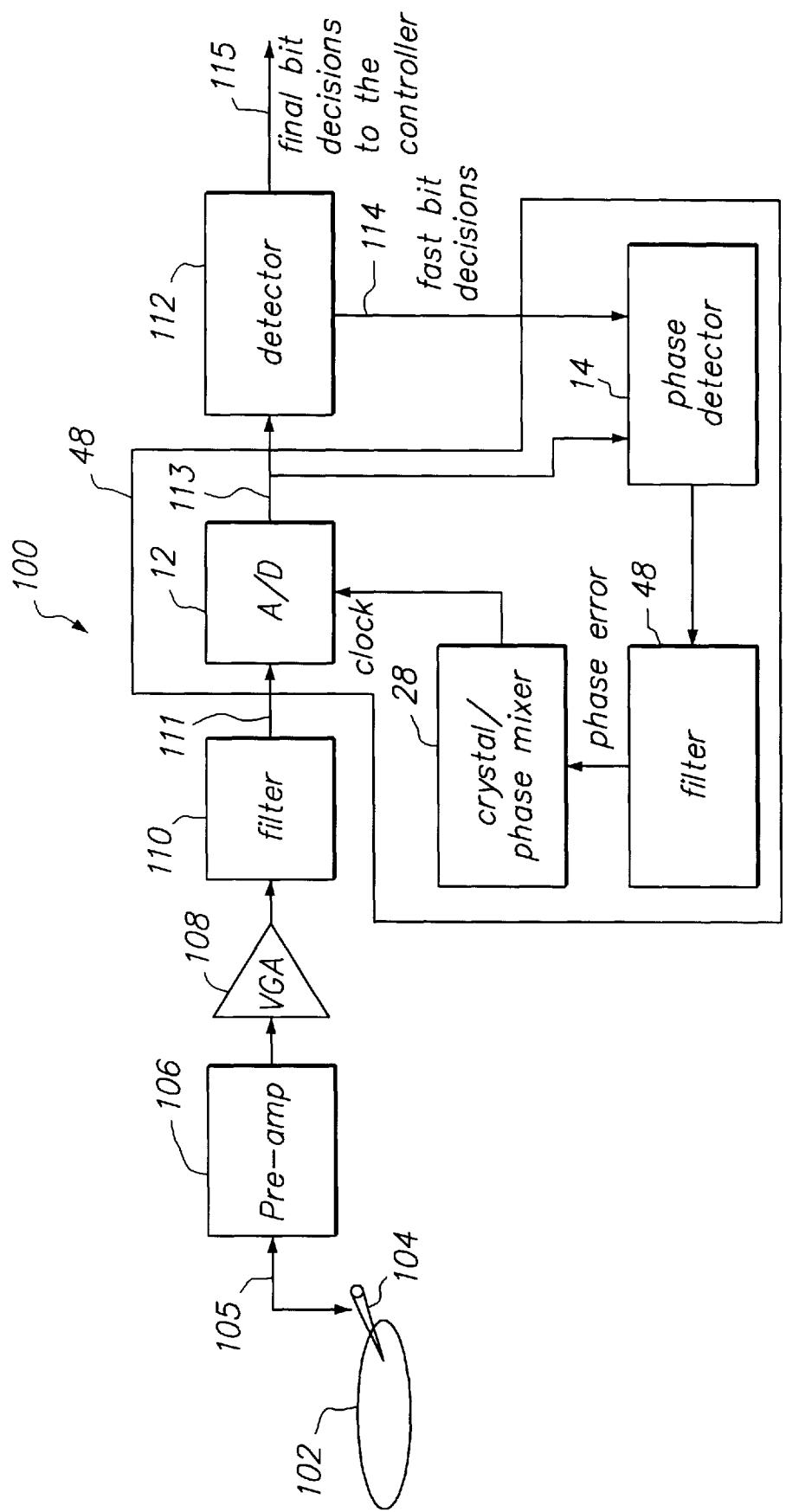
FIG. 2 is a generalized block diagram of a storage media system having a loop latency compensated PLL filter provided according to the principles of this invention.

FIG. 2 illustrates a generalized block diagram of a storage media system having a loop latency compensated PLL filter provided according to the principles of this invention. Storage media system 100 comprises a storage media 102 coupled to a media head 104 for reading data signals from storage media 102. A pre-amplifier 106 (Pre-Amp) is coupled to receive read data signal 105 from head 104 and generate a corresponding amplified read data signal 106. A control amplifier (VGA) 108 is coupled to Pre-Amp 106 to receive the amplified data signal 106 and generate an associated corresponding controlled amplified data signal. A low-pass filter 110 is coupled to the VGA 108 to receive the controlled amplified data signal and generate an associated shaped analog data signal 111 having reduced high-frequency components. A low-latency compensated PLL filter 48, as is described in greater detail relative to FIGS. 2 and 3, is coupled to low-pass filter 110 receive as input the shaped analog input signal 111 and generating a loop latency compensated signal 113 having loop latency compensation, as well as reduced phase error and jitter. A detector circuit 112 is also provided and coupled to loop latency compensated PLL filter 48 to receive loop latency compensated signal 113 and generate a corresponding digital value 115 of 1's and 0's, typically then provided to a controller (not shown). In the preferred embodiment, phase detector 14 is also coupled to detector 112 to receive a reduced sampled digital value 114 ("fast bit decision") to thereby quickly re-create the original analog signal from A/D 12 and compare the re-created signal to the waveform having phase error from A/D 12.

FIG. 3 illustrates a generalized block diagram of a loop latency compensated PLL filter 48 shown in FIG. 2 provided according to the principles of this invention. In loop latency compensated PLL filter 48, two additional feedback terms, a delayed phase signal 33 from delay register 32 and a state compensation signal 43 provided by a state term generator 64, are provided as additional input of a filter 62 of PLL 48. State term X is defined as $$X=(x_1, x_2, \ldots x_n) \quad \text{Eq. 1}$$

where $x_i$ is the output of the ith filter register of $z^{-1}$ and n is the order of the PLL. Frequency compensation term 43 is thus a linear combination of the components of the state term X. Accordingly, as described further in the detailed example of FIG. 4, filter 62 input comprises delayed phase compensation signal 33, state compensation signal 43, and a phase estimated error output 15 from a phase detector 14 summed via adder 40 coupled at the input of a generic filter 62. Filter 62 thus provides a latency compensated phase error control output 47 that is fedback to control a phase mixer 28 for generating signal waveforms used to drive an A/D of PLL 48 in accordance with the principles of this invention. The loop latency compensated PLL 48 of this invention thus minimizes the jitter of the PLL circuit, provides higher format efficiency, and also has reduced sensitivity to large bursty noises.

Figure 4:
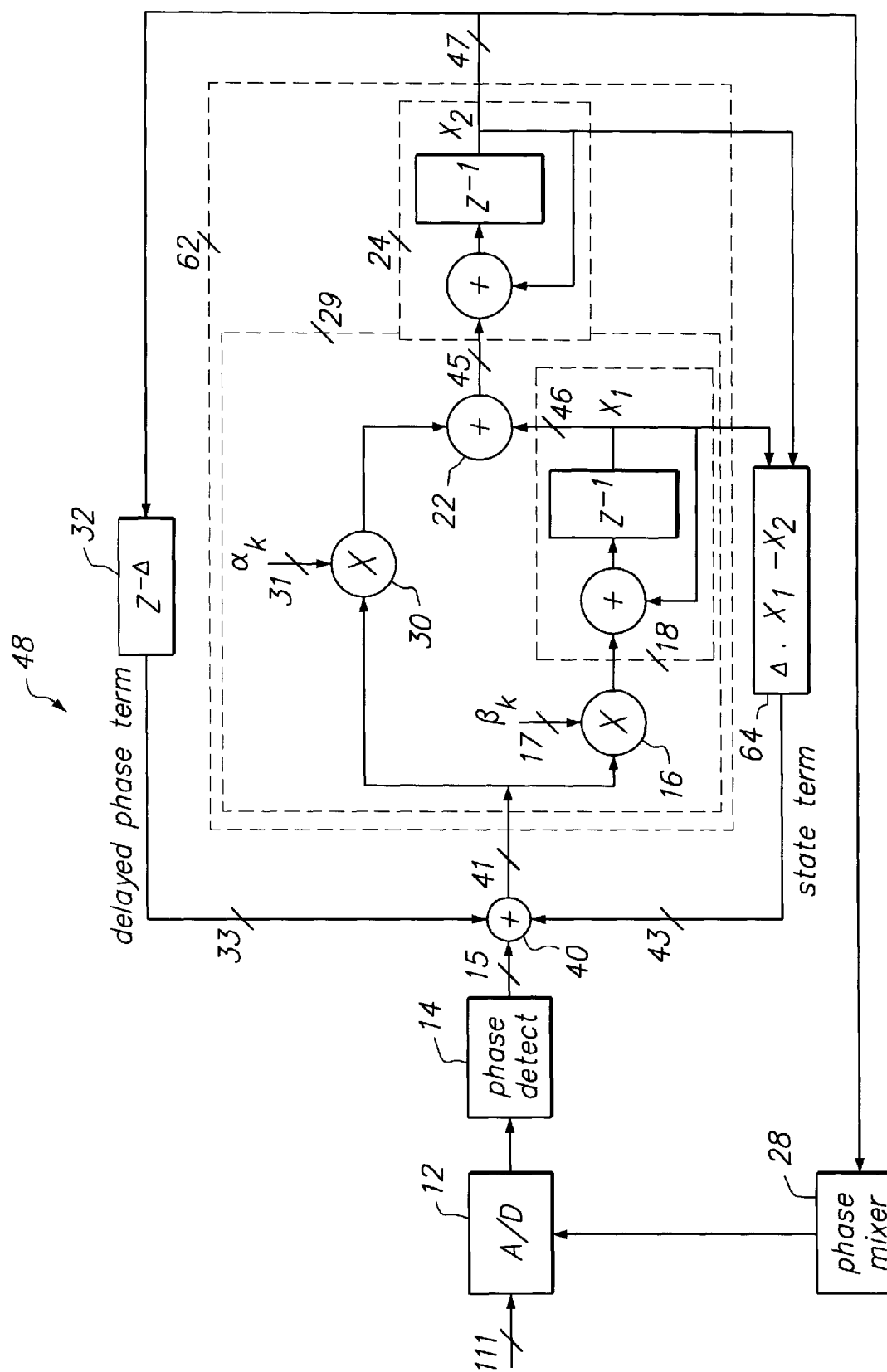
FIG. 4 is an example of a more detailed embodiment of the loop latency compensated PLL filter of FIG. 3 provided according to the principles of this invention.

FIG. 4 illustrates one example of a more detailed embodiment of the loop latency compensated PLL filter 48 of FIG. 3 provided according to the principles of this invention. Accordingly, the description and operation provided for loop latency compensated PLL filter of FIG. 3 also applies to FIG. 4. In particular, FIG. 4 illustrates an example of a more detailed embodiment of filter 62. Filter 62 of loop latency compensated PLL 50 comprises a proportional integral filter (PI filter) 29 and an accumulator 24. Loop latency compensated PLL filter 50 comprises loop delay component attributable to pipe-lines, timing constraints introduced by hardware logic, and delay due to the algorithm of phase detector 14. The loop delay Δ is distributed throughout the PLL. Hence, to compensate the presence of Δ delays in the loop, two feedback terms (state compensation 43) and (delayed phase compensation 33) are added to PLL filter 50. Accordingly, an input analog signal 11 is received by A/D 12, which is coupled to phase detector 14 to thereby generate an estimated delay. Phase detector 14 is coupled to provide estimated delay error 15 to a compensation adder 40.

Compensation adder 40 is coupled to receive two additional compensation signals: delayed phase compensation 33 and state compensation 43. Consequently, compensation adder 40 provides a modified error signal 41 as input to proportional integrator filter 29 which provides a latency compensated phase estimate signal output 45 to second accumulator 24. Output of second accumulator 24 thus comprises a latency compensated phase control signal 47 that is fedback to control a phase mixer 28 to generate a square waveform used to drive A/D 12. In addition the second accumulator 24 is coupled to a state term generator 32 to generate a delayed phase compensation 33.

Figure 5:
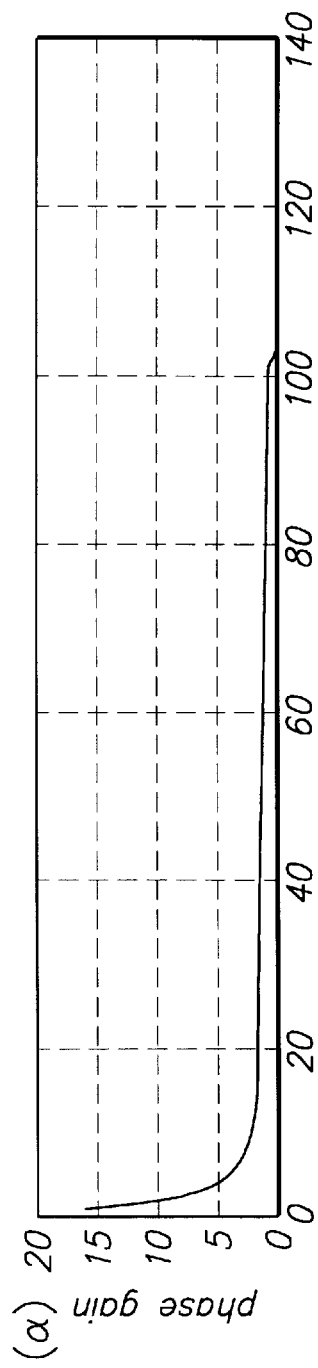
FIG. 5 is a timing illustration of phase component (alpha) versus the number of samples for the loop latency compensated PLL of FIG. 4.
Figure 6:
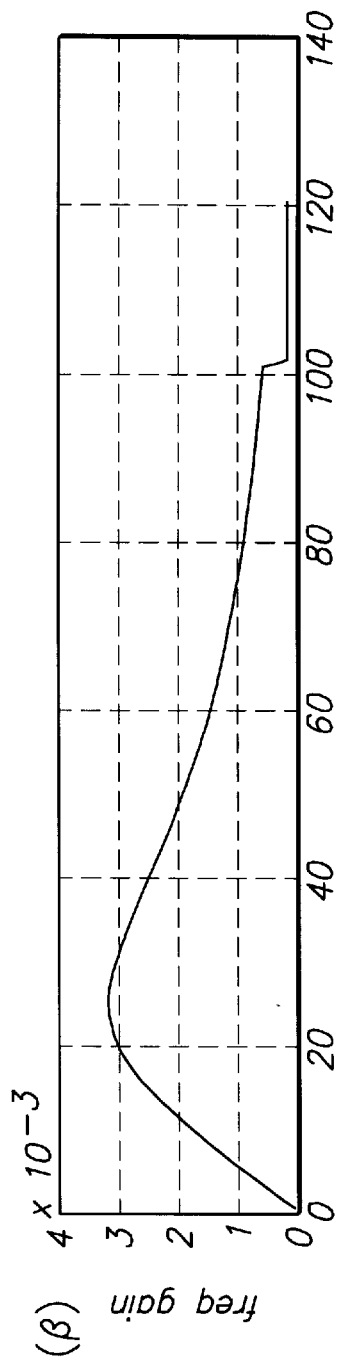
FIG. 6 is a timing illustration of the estimated error component (beta) versus the number of samples for the loop latency compensated PLL of FIG. 4.
Figure 7:
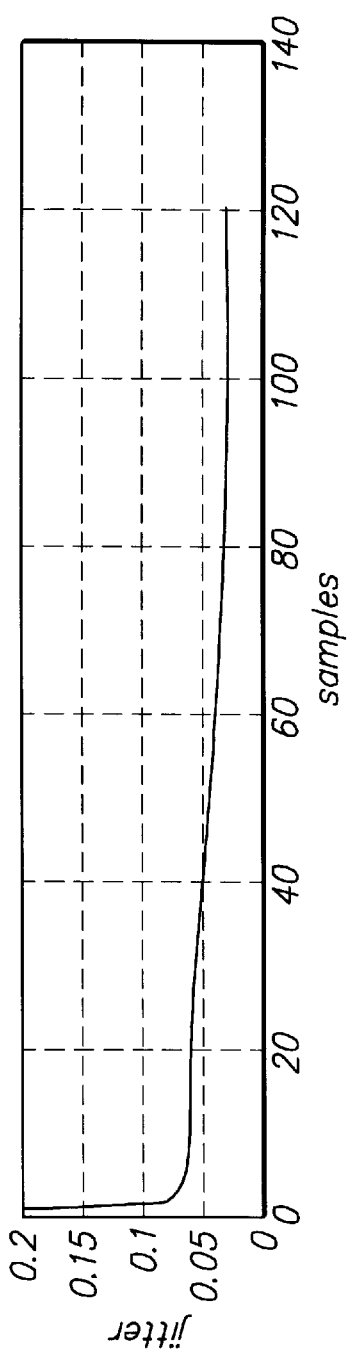
FIG. 7 is a timing illustration of the jitter versus the number of samples for the loop latency compensated PLL of FIG. 4.

FIG. 5 provides a sample timing illustration of phase (alpha) coefficient varying over time for PLL 50 in accordance with the principles of this invention. FIG. 6 provides a sample timing illustration of frequency (beta) coefficient varying over time for PLL 50 in accordance with the principles of this invention. And as illustrated in FIG. 7, the associated jitter variance over time diminishes for PLL 50 as more samples are observed.

The main advantage of loop latency compensated PLL circuits 48 and 50 in accordance with the principles of this invention is the minimization of phase jitter as illustrated in FIG. 6. Moreover, PLLs 48 and 50 have the same performance as a Kalman Δ step predictor and thus would provide optimal PLL performance. Another advantage of PLLs 48 and 50 is reduced acquisition time, thus providing higher format efficiency. Finally, since during PLL acquisition, the coefficients becomes smaller over time, PLLs 48 and 50 would therefore not be as sensitive to large bursty noises, such as found in media defects) just prior to end of acquisition time.

Foregoing described embodiments of the invention are provided as illustrations and descriptions. They are not intended to limit the invention to precise form described. In particular, it is contemplated that functional implementation of invention described herein may be implemented equivalently in hardware, software, firmware, and/or other available functional components or building blocks. Other variations and embodiments are possible in light of above teachings, and it is thus intended that the scope of invention not be limited by this Detailed Description, but rather by the following claims.

What is claimed is:

1. A storage media system comprising:

a storage media having a media head for reading data from the storage media and generating a corresponding data signal;

a pre-amplifier coupled to the media head to receive a corresponding data signal and generating an amplified data signal;

a control amplifier (VGA) coupled to the pre-amplifier to receive the amplified data signal and generate an associated controlled amplified data signal;

a low-pass filter coupled to received the controlled amplified data signal and generating an associated shaped analog data signal; and a loop latency compensated PLL filter coupled to the low-pass filter to receive the shaped analog data signal, the loop latency compensated PLL filter comprising:

an analog-to-digital converter (A/D), the A/D receiving the shaped analog data signal and generating a digitized signal;

a phase detector, the phase detector coupled to the A/D to receive the digitized signal and generating an estimated phase error;

a second filter coupled to the phase detector to receive as a first input the estimated phase error, the second filter also coupled to a delayed phase compensation register to receive a phase compensation input signal, and to a state compensation multiplier to receive a state compensation input signal, wherein the filter provides a latency compensated phase error output; and a second accumulator that is coupled to the second filter to receive the latency compensated phase error output and generate a latency compensated phase error control signal.

2. A loop latency compensated PLL filtering process comprising:

transmitting an analog signal to an analog-to-digital converter (A/D), the A/D being coupled to a phase detector;

generating an estimated phase error with the phase detector and transmitting the estimated phase error to an input of a filter coupled to the phase detector;

providing also a delayed phase compensation signal and a state compensation signal to the input of the filter to thereby calculate and generate a loop latency compensated phase error signal at an output of the filter;

providing the loop latency compensated phase error signal to a second accumulator to generate a latency compensated phase error control signal; and controlling a phase mixer with the latency compensated phase error control signal to generate an A/D control signal to drive the A/D.

3. The loop latency compensated PLL filtering process of claim 2 wherein the filter comprises a proportional integral filter.

4. A loop latency compensated PLL filter comprising:

an analog-to-digital converter (A/D), the A/D receiving an analog input signal and generating a digitized signal;

a phase detector, the phase detector coupled to the A/D to receive the digitized signal and providing an estimated phase error;

a filter coupled to the phase detector to receive as a first input the estimated phase error, the filter also coupled to a delayed phase compensation register to receive a phase compensation input signal, and to a state compensation multiplier to receive a state compensation input signal, wherein the filter provides a latency compensated phase error output; and a second accumulator that is coupled to the filter to receive the latency compensated phase error output and generate a latency compensated phase error control signal.

5. The loop latency compensated PLL filter of claim 4 wherein the filter comprises a PI filter.

6. The loop latency compensated PLL filter of claim 5 wherein the PI filter comprises a first adder receiving as input, the estimated phase error, the delayed phase compensation signal, and the state compensation signal.

7. The loop latency compensated PLL filter of claim 5 further comprising a phase mixer coupled to receive the filtered estimated phase error output from the second accumulator to thereby control the phase mixer that drives the A/D.

8. The loop latency compensated PLL filter of claim 5 further comprising a delayed phase compensation accumulator coupled to the second accumulator to receive the filtered estimated phase error output and provide as an output the delayed phase compensation signal.

* * * * *

UNITED STATES PATENT AND TRADEMARK OFFICE
CERTIFICATE OF CORRECTION

PATENT NO. : 6,236,343 B1
DATED : May 22, 2001
INVENTOR(S) : Patapoutian

It is certified that error appears in the above-identified patent and that said Letters Patent is hereby corrected as shown below:

<u>Column 4, claim 1,</u>
Line 52, replace "received" with -- receive --.

Signed and Sealed this

Fifth Day of March, 2002

Attest:

JAMES E. ROGAN
Attesting Officer    Director of the United States Patent and Trademark Office